(12) United States Patent
Seri et al.

(10) Patent No.: US 12,339,502 B2
(45) Date of Patent: Jun. 24, 2025

(54) ADAPTABLE LENS ASSEMBLY

(71) Applicant: Mellanox Technologies, Ltd., Yokneam (IL)

(72) Inventors: Hen Seri, Poria Kfar Avoda (IL); Garold Kupershmid, Qiriat Motzkin (IL); Nimer Khutaba, Rieneh Village (IL); Moran Izhak Loebl, Haifa (IL); Oleg Malyi, Kiryat Shmona (IL); Nizar Omari, Nazareth (IL)

(73) Assignee: Mellanox Technologies, Ltd., Yokneam (IL)

( * ) Notice: Subject to any disclaimer, the term of this patent is extended or adjusted under 35 U.S.C. 154(b) by 1100 days.

(21) Appl. No.: 17/236,504

(22) Filed: Apr. 21, 2021

(65) Prior Publication Data

US 2022/0346223 A1  Oct. 27, 2022

(51) Int. Cl.
*G02B 6/42* (2006.01)
*G02B 6/43* (2006.01)
*H05K 3/34* (2006.01)
*H05K 1/18* (2006.01)

(52) U.S. Cl.
CPC .............. *G02B 6/4204* (2013.01); *G02B 6/43* (2013.01); *H05K 3/341* (2013.01); *H05K 1/181* (2013.01); *H05K 2203/176* (2013.01)

(58) Field of Classification Search
CPC ......... G02B 6/4204; G02B 6/43; H05K 3/341
See application file for complete search history.

(56) References Cited

U.S. PATENT DOCUMENTS

| | | | |
|---|---|---|---|
| 2005/0160442 A1* | 7/2005 | Kaplowitz | G11B 33/045 720/719 |
| 2005/0271391 A1* | 12/2005 | Togami | H04B 10/40 398/164 |
| 2015/0325507 A1* | 11/2015 | Uzoh | B23K 35/0266 257/737 |
| 2019/0377141 A1* | 12/2019 | Chen | H05K 3/0026 |
| 2021/0173158 A1* | 6/2021 | Qian | G02B 6/4206 |

* cited by examiner

*Primary Examiner* — Sung H Pak
*Assistant Examiner* — Hoang Q Tran
(74) *Attorney, Agent, or Firm* — Moore & Van Allen PLLC; Michael M. McCraw

(57) ABSTRACT

Adaptable lens assemblies, optoelectronic components, and associated methods of manufacturing are provided. An example optoelectronic component includes a printed circuit board (PCB) and an adaptable lens assembly. The adaptable lens assembly includes a lens packaging structure supporting an optical lens at a focal distance and a lens support structure. The lens support structure defines a first side configured to support the lens packaging structure and maintain the focal distance and a second side removably attached to the PCB. The attachment between the second side of the lens support structure and the PCB is configured to enable selective attachment and detachment of the lens support structure and lens packaging structure supported thereon without causing damage to the PCB.

18 Claims, 7 Drawing Sheets

ADAPTABLE LENS ASSEMBLY

TECHNOLOGICAL FIELD

Example embodiments of the present disclosure relate generally to optoelectronic devices and, more particularly, to lens assembly configurations that enable the selective attachment and detachment of an optical lens.

BACKGROUND

Optoelectronic systems and devices may be used to provide optical signal transmission between datacenter components and other networking environments. In order to facilitate signal transmission, various optoelectronic components may employ optical lenses and associated assemblies that focus, diverge, reflect, refract, or otherwise direct optical signals between devices. Due to the delicate and intricate nature of optical lenses, the successful operation of these optoelectronic components is often dependent upon the integrity of the related optical lenses. Applicant has identified a number of deficiencies and problems associated with conventional lens assemblies and methods for manufacturing the same. Through applied effort, ingenuity, and innovation, many of these identified problems have been solved by developing solutions that are included in embodiments of the present disclosure, many examples of which are described in detail herein.

BRIEF SUMMARY

Apparatuses, systems, and associated methods of manufacturing are provided for optoelectronic components and adaptable lens assemblies for use with the same. An example adaptable lens assembly may include a lens packaging structure that supports an optical lens at a focal distance and a lens support structure. The lens support structure may include a first side that supports the lens packaging structure and maintains the focal distance. The lens support structure may further include a second side configured to removably attach the lens support structure to a printed circuit board (PCB). The attachment between the second side of the lens support structure and the PCB may enable selective attachment and detachment of the lens support structure and supported lens packaging structure without damage to the PCB.

In some embodiments, a first side of the lens packaging structure may further include a recess configured to at least partially receive the lens support structure therein.

In some embodiments, the lens support structure further includes two or more metal elements.

In some further embodiments, each of the metal elements may define a cavity. In such an embodiment, each cavity of the metal elements may removably attach the lens support structure to the PCB via solder deposited therein.

In some still further embodiments, the metal elements, when subjected to a defined temperature, may be configured to detach the lens support structure from the PCB via melting of the solder disposed between the lens support structure and the PCB.

In some embodiments, the lens packaging structure may be secured to the lens support structure via an adhesive. In such an embodiment, the adhesive may be an epoxy.

The above summary is provided merely for purposes of summarizing some example embodiments to provide a basic understanding of some aspects of the present disclosure. Accordingly, it will be appreciated that the above-described embodiments are merely examples and should not be construed to narrow the scope or spirit of the disclosure in any way. It will be appreciated that the scope of the present disclosure encompasses many potential embodiments in addition to those here summarized, some of which will be further described below.

BRIEF DESCRIPTION OF THE DRAWINGS

Having described certain example embodiments of the present disclosure in general terms above, reference will now be made to the accompanying drawings. The components illustrated in the figures may or may not be present in certain embodiments described herein. Some embodiments may include fewer (or more) components than those shown in the figures.

DETAILED DESCRIPTION

Overview

Figure 1:
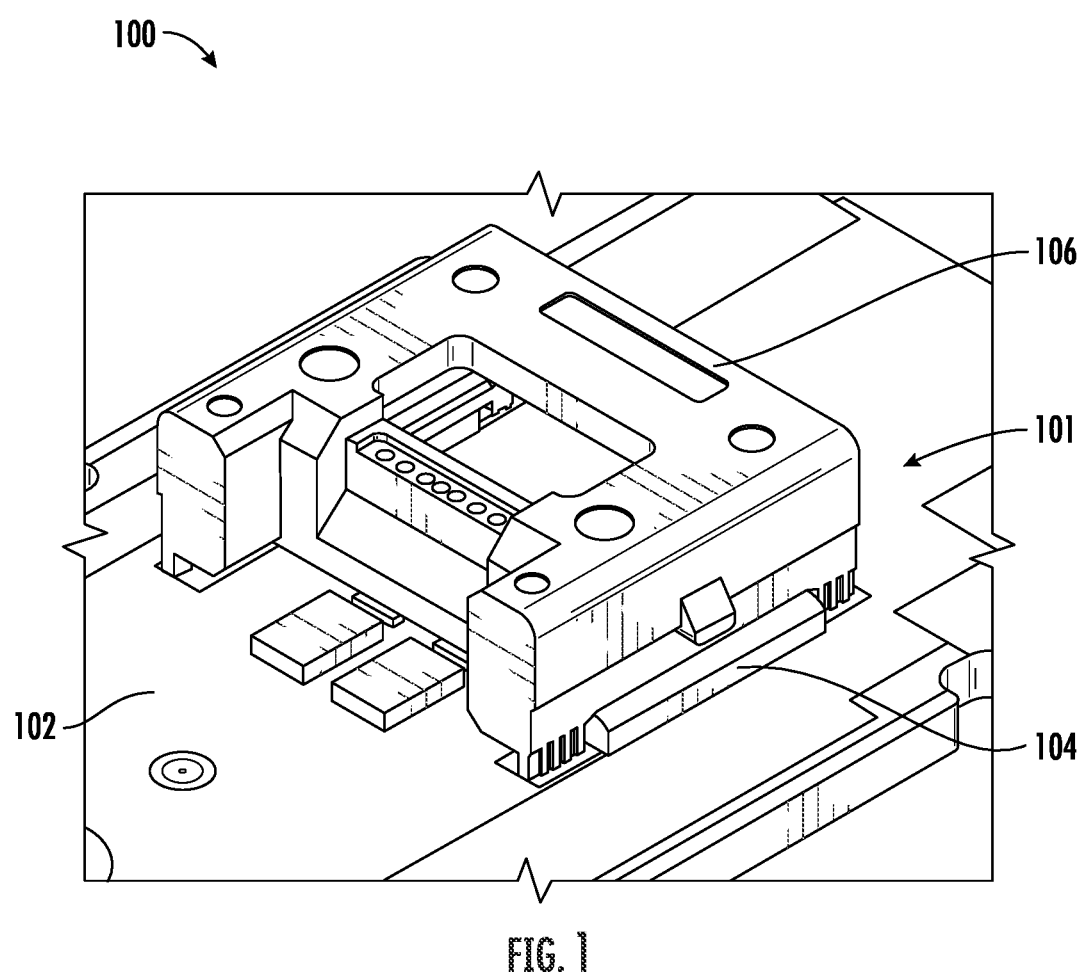
FIG. 1 illustrates an example optoelectronic component including an adaptable lens assembly in accordance with some embodiments described herein.

Embodiments of the present disclosure now will be described more fully hereinafter with reference to the accompanying drawings in which some but not all embodiments are shown. Indeed, the present disclosure may be embodied in many different forms and should not be construed as limited to the embodiments set forth herein; rather, these embodiments are provided so that this disclosure will satisfy applicable legal requirements. Like numbers refer to like elements throughout. As used herein, terms such as "front," "rear," "top," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

As described above, optoelectronic systems and devices may be used to provide optical signal transmission between datacenter components and other networking environments and may employ optical lenses and associated assemblies to facilitate this signal transmission. In order to provide accurate optical signal transmission, optical lens assemblies require precise alignment relative to other optical components, such as vertical-cavity surface-emitting lasers (VCSELs) and photodiodes. As such, any imperfections associated with a lens or any misalignments introduced in the assembly of lenses with respect to an optoelectronic component may significantly impact the operational capabilities of the optoelectronic component. For example, lenses may be misshapen, scratched, chipped, or otherwise defective as a result of the manufacturing processes used to create the lenses, or these imperfections may be introduced during one or more assembly processes associated with the optical lenses.

Traditional methods for assembling optoelectronic components have relied upon permanently securing optical lenses to, for example, printed circuit boards (PCBs) or other substrates. For example, conventional systems often rely upon epoxy glues for directly attaching a lens to the PCB where, once applied, the glue is subjected to a curing process in which the glue is permanently hardened. If a lens assembly is faulty or misaligned, attempted removal of the cured epoxy glue results in damage to the components (e.g., capacitors, electrical traces or wires, etc.) proximate this adhesive. Furthermore, adhesive (e.g., cured epoxy glue) residue often remains on the surface of the PCB preventing accurate alignment of a subsequent lens with the PCB. Given that lens installation often occurs during late-stage optoelectronic component assembly, permanently securing faulty lens assemblies to PCBs resulting in defective optoelectronic components represents a large cost in lost time and materials used to create these components.

In order to address these issues and others, the devices of the present disclosure provide an adaptable lens assembly with a lens support structure that is removably attached to a PCB. In particular, the adaptable lens assembly and associated methods described hereafter enable selective attachment and detachment of a lens support structure such that an optical lens may be easily replaced without damage to the PCB. In this way, the PCB may be reused with subsequent lens assemblies reducing the cost of production associated with manufacturing optoelectronic components. Furthermore, by reducing the cost of production, the adaptable lens assemblies of the present disclosure provide opportunities to improve optoelectronic component quality without an increase in the total component cost.

Adaptable Lens Assembly

With reference to FIG. 1, an example optoelectronic component 100 is illustrated. As shown, the optoelectronic component 100 may include a printed circuit board (PCB) 102 and an adaptable lens assembly 101. As described hereafter, the adaptable lens assembly 101 may include a lens packaging structure 106 and a lens support structure 104 supporting the same. The PCB 102 may define a substrate configured to support optoelectronic components thereon and facilitate the transmission of optical and electrical signals. The PCB 102 may be created by any means appropriate for creating substrates or PCBs (e.g., subtractive processes, additive processes, semi-additive processes, chemical etching, copper patterning, lamination, plating and coating, or the like) and may include a dielectric material, a glass material, a polymer material, an amorphous material, or the like. Said differently, the present disclosure contemplates that the PCB 102 (e.g., a substrate) may comprise any material configured for use with optoelectronic components and/or configured to define or support electrical connection elements or features (e.g., wires, traces, etc.) to provide electrical connectivity between optoelectronic components.

Figure 2:
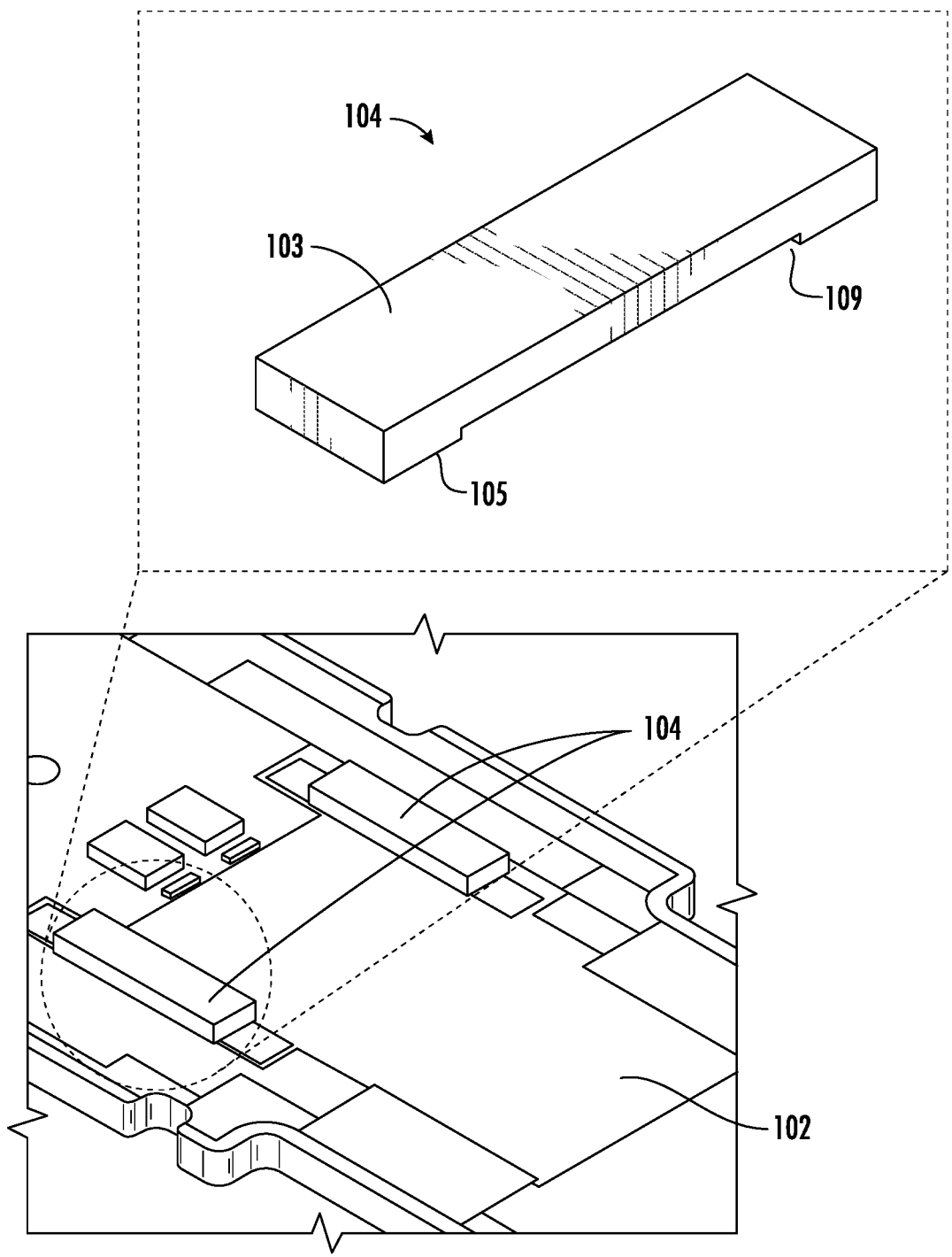
FIG. 2 illustrates an example lens support structure and printed circuit board (PCB) in accordance with some embodiments described herein.

With reference to FIG. 2, the adaptable lens assembly (e.g., assembly 101 in FIG. 1) may include a lens support structure 104 for supporting the lens packaging structure 106 described hereafter with reference to FIGS. 3A-3D. As shown, the lens support structure 104 may define a first side 103 and a second side 105 that is configured to removably attach the lens support structure 104 to the PCB 102. The lens support structure 104 may be configured, via the second side 105, to contact the PCB 102 proximate one or more optoelectronic elements (not shown) of the PCB 102. Said differently, the relative positioning of the lens support structure 104 may be such that it supports and positions the lens packaging structure 106 described hereafter relative to these optoelectronic elements (not shown). By way of example, the PCB 102 may support one or more VCSELs, photodiodes, or the like configured to generate and/or receive optical signals, and the lens support structure 104 may be configured to position the lens packaging structure 106 proximate the VCSELs, photodiodes, or the like so as to facilitate optical signal transmission to one or more of these elements. The present disclosure, however, contemplates that the lens support structure 104 may be located at any position on the PCB 102 based upon the intended application of the optoelectronic component 100.

With continued reference to FIG. 2, the lens support structure 104 may, in some embodiments, include two or more metal elements. As described hereafter with reference to the removable attachment of the lens support structure 104 with the PCB 102, the metal elements may be, for example, soldered to the PCB 102. To this end, the second side 105 of the lens support structure(s) 104 may further define a cavity 109. As shown, the cavity 109 may extend along at least a portion of the second side 105 and be configured to, in an instance in which the lens support structure includes one or more metal elements, receive solder disposed or deposited therein. For example, two (2) or more metal elements (e.g., the lens support structure 104) may be positioned on the PCB 102 and soldered to the PCB 102. In this way, the cavity 109 may be configured to ensure the relative positioning of the lens support structure 104 (e.g., defining a particular distance between the PCB 102 and the first surface 103). Said differently, the cavity 109 may provide space in which the solder may be disposed or deposited such that the lens support structure 104 may remain substantially flush with the PCB 102.

Although described herein with reference to a cavity 109, the present disclosure contemplates that the lens support structure 104 may include any opening, trench, indention, or the like configured to received solder therein. Furthermore, although illustrated with two (2) rectangular, metal elements in FIG. 2, the present disclosure contemplates that the lens support structure 104 may include any number of metal elements having any dimensions (e.g., size and/or shape) based upon the intended application of the optoelectronic component 100. Still further, although described herein with reference to removable attachment via a soldering operation, the present disclosure contemplates that the second side 105 of the lens support structure 104 may be removably attached to the PCB 102 via other methods so long as the structural integrity of the PCB 102 and the optoelectronic elements (not shown) supported thereon are maintained.

Figure 3A:
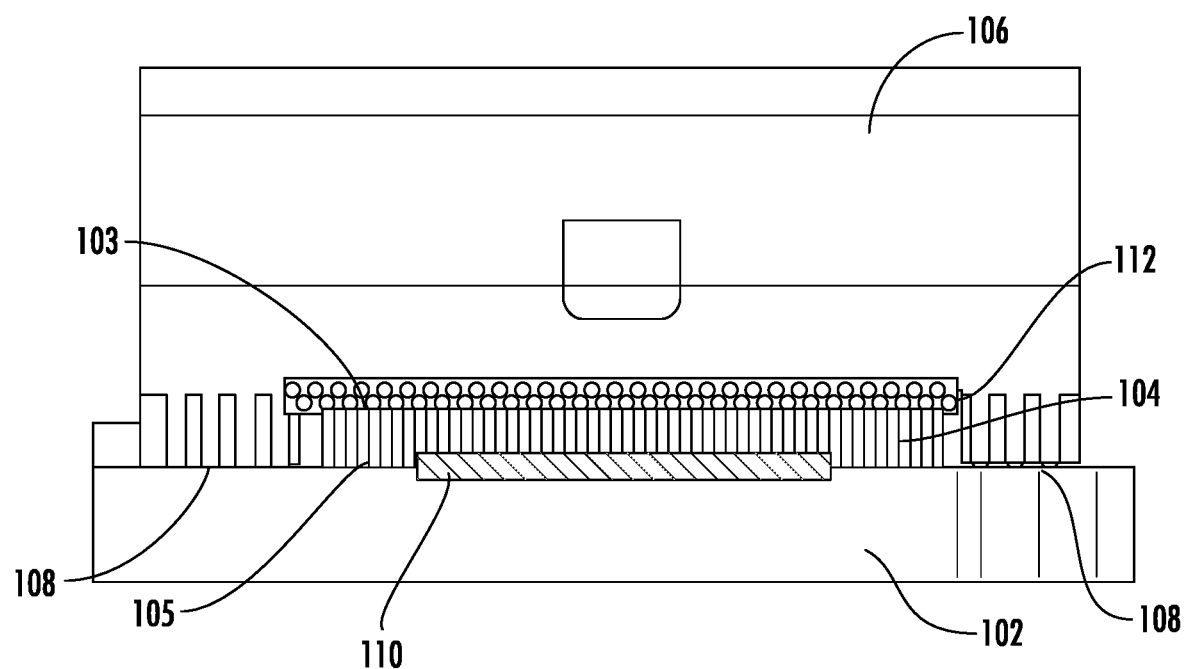
FIG. 3A illustrates a side-view of the optoelectronic component and adaptable lens assembly of FIG. 1 in accordance with some embodiments described herein.
Figure 3B:
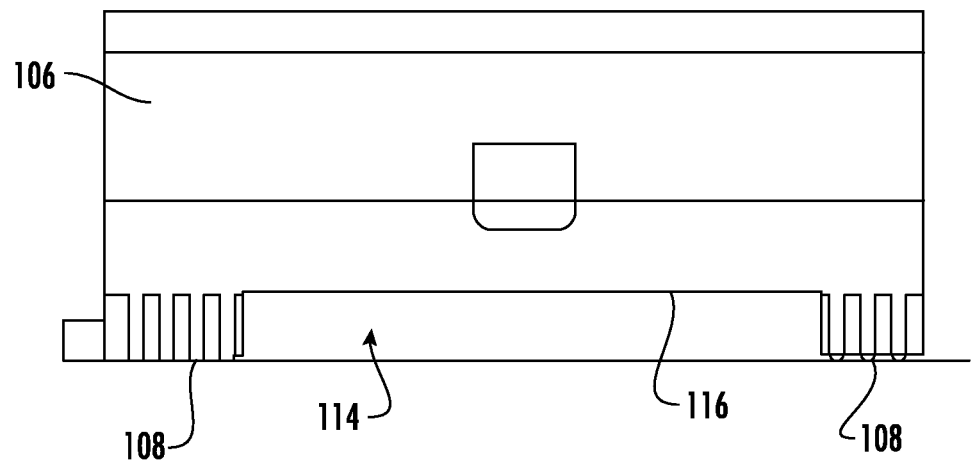
FIG. 3B illustrates a side view of a lens packaging structure in accordance with some embodiments described herein.
Figure 3C:
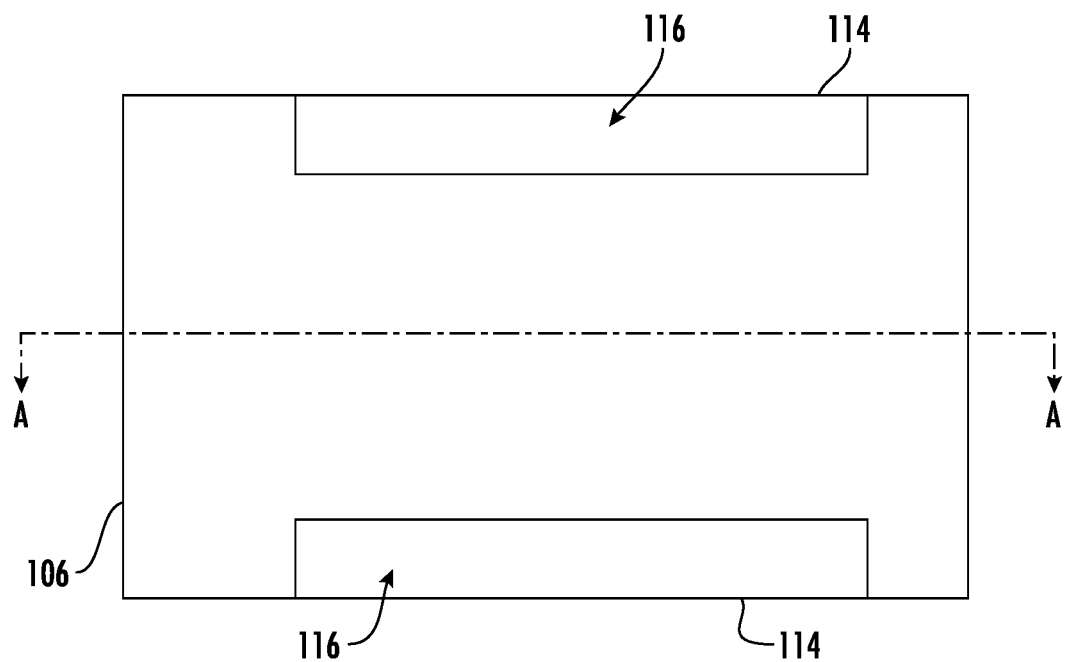
FIG. 3C illustrates a bottom view of the lens packaging structure of FIG. 3B in accordance with some embodiments described herein.
Figure 3D:
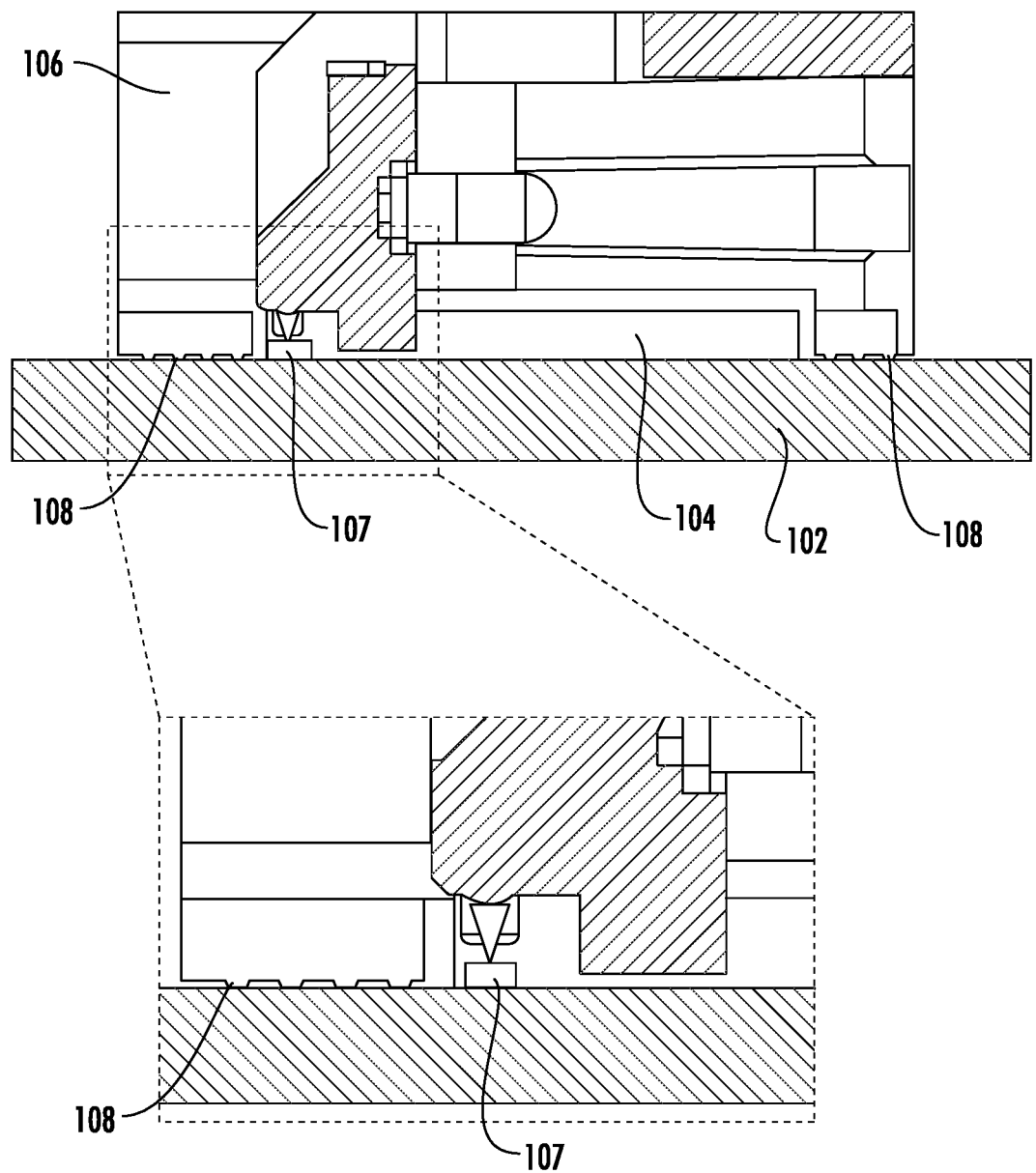
FIG. 3D illustrates a cross-sectional view of the example optoelectronic component of FIG. 3A along line A-A in accordance with some embodiments described herein.

With reference to FIGS. 3A-3D, the adaptable lens assembly 101 of the optoelectronic component 100 may include the lens packaging structure 106. As shown in FIG. 3D, the lens packaging structure 106 may include an optical lens 107 configured to focus, diverge, reflect, refract, or otherwise direct optical signals between optoelectronic elements. By way of example, the optical lens 107 may be configured to receive optical signals generated by a VCSEL (not shown) supported by the PCB 102 and direct the optical signals to one or more optical transmission mediums (e.g., optical fibers, cables, or the like). Similarly, the optical lens 107 may be configured to received optical signals transmitted by one or more optical transmission mediums and direct the optical signals to one or more photodiodes (not shown). As would be evident to one of ordinary skill in the art in light of the present disclosure, the optical lens 107 may be associated with a focal distance or focal length (e.g., a distance from the center of the lens to the focal points) indicative of the optical lens's 107 ability to converge or diverge optical signals (e.g., light). For example, a positive focal length value may be indicative of a lens that converges light, and a negative focal length value may be indicative of a lens that diverges light. In thin lens applications (e.g., a lens with a thickness that is negligible relative to its radii of curvature), the focal length or distance may refer to the distance over which, for positive values, collimated or parallel light rays are focused. As such, the present disclosure contemplates that the focal distance or length of the optical lens 107 may vary based upon the intended application of the optoelectronic component 100.

As shown in FIG. 3A, the second surface 105 of the lens support structure 104 may be configured to be removably attached to the PCB 102 via solder disposed between the PCB 102 and the second surface 105. The first surface 103 of the lens support structure 104 may be configured to support the lens packaging structure 106. The lens packaging structure 106 may define an housing configured to support the optical lens 107 at a focal length as described above and may be dimensioned (e.g., sized and shaped) based upon the intended application of the optoelectronic component 100 and as regulated by associated industry standards. The lens packaging structure 106 may define a first side 116 configured to at least partially contact the lens support structure 104. As shown in FIG. 3A, the adaptable lens assembly 101 may include an adhesive 112 (e.g., epoxy or otherwise) disposed between the first side 116 of the lens packaging structure 106 and the first side 103 of the lens support structure 104 configured to secure the lens packaging structure 106 to the lens support structure 104. In some example embodiments, as illustrated in FIGS. 3A-3D, the first side 116 of the lens packaging structure 106 may define a recess 114 configured to at least partially receive the lens support structure 104 therein.

By way of continued example, the lens support structure 104 may define two (2) rectangular, metal elements (e.g., copper or the like) such that the recess 114 define by the first side 116 of the lens packaging structure 106 may define a complimentary shape (e.g., a rectangular recess 114) configured to receive the two (2) rectangular, metal elements therein. As described above with reference to FIG. 3D, the focal length or distance of the optical lens 107 may be precisely determined based upon the associated optoelectronic elements, size of the components, and the like. Said differently, improper positioning of the optical lens 107 that alters this focal length or distance may result in optical signal degradation and/or the inoperability of the optoelectronic component 100. As such, the optical lens 107 may be positioned on a non-recessed portion of the first side 116 as shown in the cross-sectional view of FIG. 3D. The attachment between the lens support structure 104 and the lens packaging structure 106 via the recess 114 may be such that the relative distance between the lens packaging structure, particularly the optical lens 107, and the PCB 102 is maintained. Said differently, the recess 114 of the lens packaging structure 106 may operate to accommodate the lens support structure 104 without impacting the focal length or distance of the optical lens 107. The lens packaging structure 106 may further include one or more electrical contacts 108 configured to provide electrical communication between the lens packaging structure 106 and one or more optoelectronic elements (not shown) supported by the PCB 102.

As described above, the optoelectronic component 100 of the present disclosure enables selective attachment and detachment of the lens support structure 104 and the lens packaging structure 106 supported thereon without damage to the PCB 102. In particular, the adaptable lens assembly 101 may rely upon a soldering process to removably attach the second side 105 of the lens support structure 104 to the PCB 102. As described hereafter with reference to the methods of FIGS. 4-5, a soldering process may refer to the joining of items by the melting and placing of a filler material or solder between the items. As would be evident to one of ordinary skill in the art in light of the present disclosure, the solder or filler material may have a melting point that is lower than the melting point of the joined items. Said differently, the solder 110 may have a melting temperature that is less than the melting temperature of the material of the PCB 102 and the material of the lens support structure 104 such that the melting of the solder 110 to join these items does not damage them (i.e., cause the PCB 102 or lens support structure 104 to partially melt). To enable selective detachment of the lens support structure 104 and the lens packaging structure 106 supported thereon from the PCB 102, heat at a defined temperature may be applied to the lens support structure based upon the type of solder 110 used. This application of heat may cause the solder 110 to sufficiently melt such that the lens support structure 104 and lens packaging structure 106 attached to the PCB 102 via adhesive 112 may be removed. A subsequent lens support structure and lens packaging assembly may be removably attached to the PCB 102 as described hereafter. To the extent that residue from the solder 110 remains on the surface of the PCB 102, unlike conventional adhesives, the heat applied to attach a subsequent lens support structure 104 may also melt this residue such that the residue is used in the removable attachment of the subsequent lens support structure 104.

Example Methods

Figure 4:
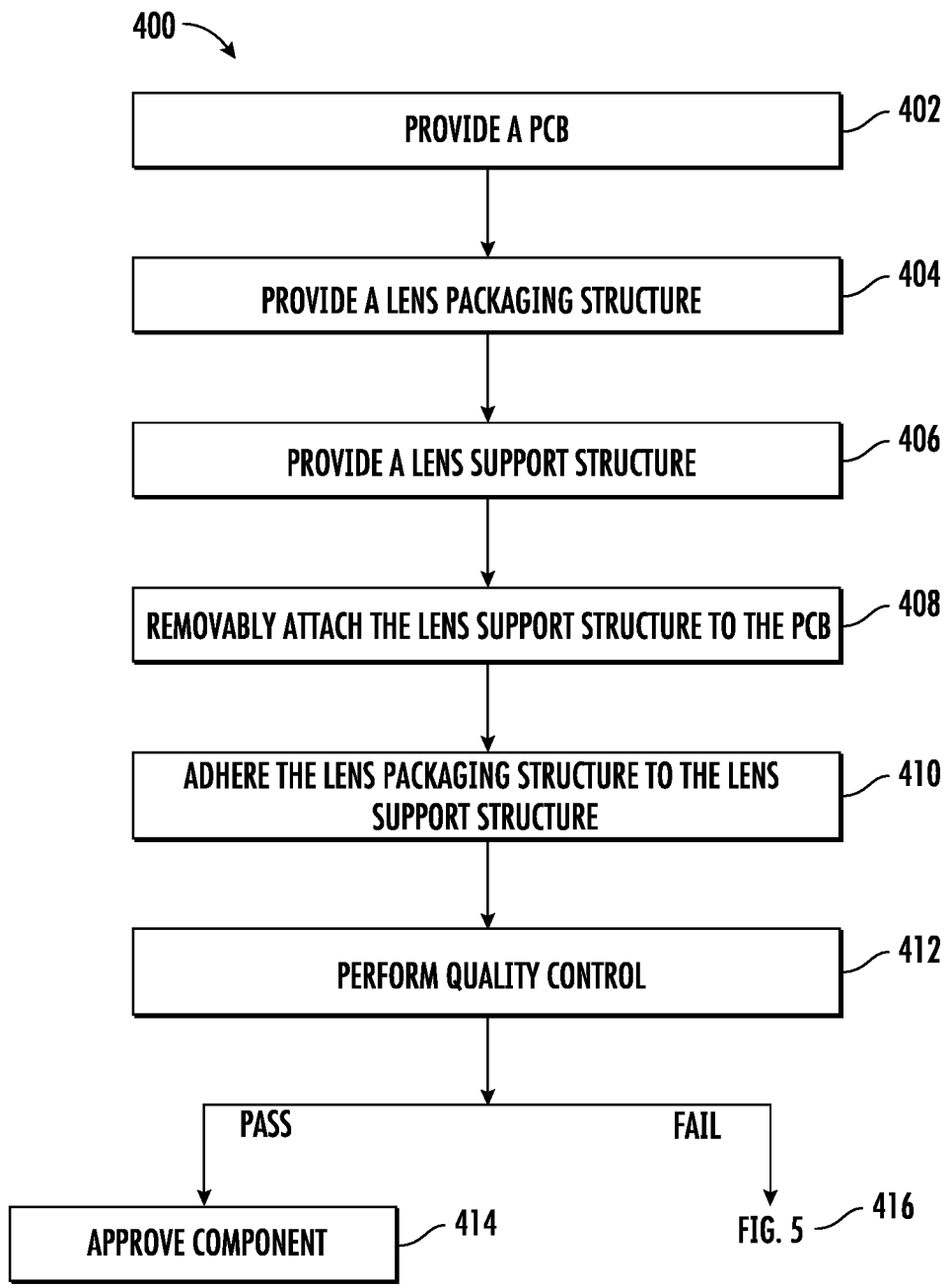
FIG. 4 is a flowchart illustrating a method of assembling an optoelectronic component in accordance with some embodiments described herein.

With reference to FIG. 4, an example method of assembling an optoelectronic component is illustrated. The method (e.g., method 400) may include the step of providing a PCB at operation 402. As described above, the PCB may define a substrate configured to support optoelectronic components thereon and facilitate the transmission of optical and electrical signals. The PCB may be created by any means for creating substrates or PCBs (e.g., subtractive processes, additive processes, semi-additive processes, chemical etching, copper patterning, lamination, plating and coating, or the like) and may include a dielectric material, a glass material, a polymer material, an amorphous material, or the like. Said differently, the present disclosure contemplates that the PCB (e.g., a substrate) may comprise any material configured for use with optoelectronic components and/or configured to define or support electrical connection elements or features (e.g., wires, traces, etc.) to provide electrical connectivity between optoelectronic components.

The method (e.g., method 400) may include providing a lens packaging structure at operation 404. As described above, the lens packaging structure may include an optical lens configured to focus, diverge, reflect, refract, or otherwise direct optical signals between optoelectronic elements. The optical lens may be associated with a focal distance or focal length indicative of the optical lens's ability to converge or diverge optical signals (e.g., light). For example, a positive focal length value may be indicative of a lens that converges light, and a negative focal length value may be indicative of a lens that diverges light. In thin lens applications (e.g., a lens with a thickness that is negligible relative to its radii of curvature), the focal length or distance may refer to the distance over which, for positive values, collimated or parallel rays are focused. As such, the present disclosure contemplates that the focal distance or length of the optical lens may vary based upon the intended application of the optoelectronic component.

The method (e.g., method 400) may further include providing a lens support structure at operation 406. As described above, the lens support structure may define a first side and a second side that is configured to removably attach the lens support structure to the PCB as described hereafter with reference to operation 408. The lens support structure may be configured, via the second side, to contact the PCB proximate one or more optoelectronic elements of the PCB. Said differently, the relative positioning of the lens support structure may be such that it supports and positions the lens packaging structure relative to these optoelectronic elements. The present disclosure, however, contemplates that the lens support structure may be located at any position on the PCB based upon the intended application of the optoelectronic component. In some embodiments, the lens support structure includes two or more metal elements, and the second side of the lens support structure(s) may further define a cavity.

The method (e.g., method 400) may further include removably attaching the lens support structure to the PCB. The adaptable lens assembly may rely upon a soldering process to removably attach the second of the lens support structure to the PCB. As described above, a soldering process may refer to the joining of items by the melting and placing of a filler material or solder between the items. The solder or filler material may have a melting point that is lower than the melting point of the joined items (e.g., the materials for the lens support structure and PCB) such that the melting of the solder joins these elements without damaging (i.e., causing the PCB or lens support structure to partially melt). The lens support structure provided at operation 406 may, in some embodiments, define a cavity configured to receive solder disposed or deposited therein as described above.

The method (e.g., method 400) may further include adhering the lens packaging structure to the lens support structure at operation 410. As described above, the lens packaging structure may define a first side configured to at least partially contact the lens support structure. In order to adhere or otherwise secure the lens packaging structure with the lens support structure, the adaptable lens assembly may include an adhesive (e.g., epoxy or otherwise) disposed between the first side of the lens packaging structure and the first side of the lens support structure. The application of the adhesive may further include a curing process configured to dry or harden the adhesive. In some example embodiments, the first side of the lens packaging structure may define a recess configured to at least partially receive the lens support structure therein. Although operation 410 is illustrated as occurring after operation 408 in FIG. 4, the present disclosure contemplates that, in some embodiments, the lens packaging structure may be adhered to the lens support structure prior to removable attachment of the lens packaging structure to the PCB.

The method (e.g., method 400) may further include performing quality control at operation 412. By way of example, the assembled optoelectronic component may be subjected to a functional testing procedure in which power, via the electrical contacts, is supplied to the lens packaging structure to determine if the optoelectronic component is operational. The assembled optoelectronic component may further be subjected to testing procedures that compare the optical signals transmitted by the optoelectronic component with various thresholds to ensure proper compliance for signal transmission. The present disclosure contemplates that any optoelectronic testing procedure, burn-in procedure, forward voltage monitoring, temperature monitor, or the like may be used to determine if the optoelectronic component satisfies applicable quality control metrics. In an instance in which the optoelectronic component passes or satisfies the quality control criteria, the method (e.g., method 400) may include approving the component for use at operation 414. In an instance in which the optoelectronic component fails the quality control metrics, the method (e.g., method 400) may include detaching the lens assembly at operation 416, as described below in connection with the method of FIG. 5.

Figure 5:
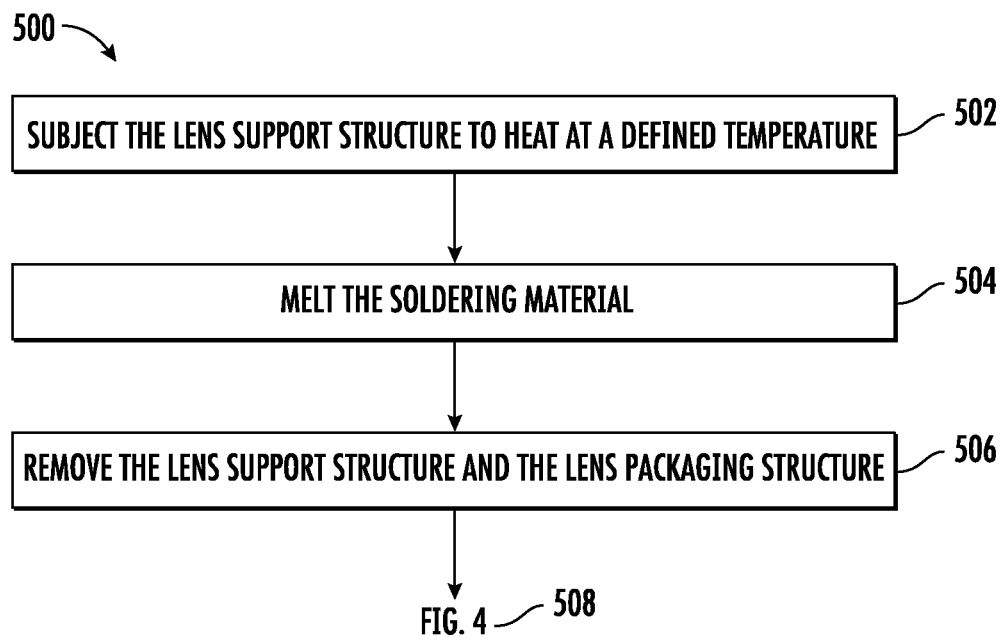
FIG. 5 is flowchart illustrating a method of lens assembly detachment in accordance with some embodiments described herein.

With reference to FIG. 5, an example method of lens assembly detachment is illustrated. The method (e.g., method 500) may include the step of subjecting the lens support structure to a defined temperature at operation 502 and melting the soldering material at operation 504. Once the quality control operations described with reference to FIG. 4 determine that the lens packaging structure is defective, the lens support structure and the lens packaging structure supported thereon are to be removed so that the PCB may be reused. As described above, the solder or filler material may have a melting point that is lower than the melting point of the lens support structure and PCB. To enable selective detachment of the lens support structure and lens packaging structure supported thereon from the PCB, heat at a defined temperature may be applied to the lens support structure based upon the type of solder used. This application of heat may cause the solder to sufficiently melt such that the lens support structure and lens packaging structure attached thereto via an adhesive may be removed. The present disclosure contemplates that the defined temperature may vary based upon the materials selected for the lens support structure, the PCB, and/or the solder.

The method (e.g., method 500) may further include removing the lens support structure and the lens packaging structure that were determined to be defective at operation 506 and subjecting the PCB to the method of FIG. 4 at operation 508, by which a subsequent lens support structure and lens packaging assembly may be removably attached to the PCB. To the extent that residue from the solder remains on the surface of the PCB, unlike conventional adhesives, the heat applied to attach a subsequent lens support structure in the operations of FIG. 4 may also melt this residue such that the residue is used in the removable attachment of the subsequent lens support structure. In this way, the PCB may be reused with subsequent lens assemblies reducing the cost of production associated with manufacturing optoelectronic components. Furthermore, by reducing the cost of production, the adaptable lens assemblies of the present disclosure provide opportunities to improve optoelectronic component quality without an increase to total component cost.

Many modifications and other embodiments of the inventions set forth herein will come to mind to one skilled in the art to which these inventions pertain having the benefit of the teachings presented in the foregoing descriptions and the associated drawings. Although the figures only show certain components of the methods and systems described herein, it is understood that various other components may also be part of any optical component or optoelectronic element. In addition, the method described above may include fewer steps in some cases, while in other cases may include additional steps. Modifications to the steps of the method described above, in some cases, may be performed in any order and in any combination.

Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. An optoelectronic component comprising:
a printed circuit board (PCB); and
an adaptable lens assembly comprising:
   a lens packaging structure supporting an optical lens at a focal distance; and
   a lens support structure defining:
      a first side removably attached to the lens packaging structure; and
      a second side removably attached to the PCB, wherein the attachment between the second side of the lens support structure and the PCB is configured to enable selective attachment and detachment of the lens support structure and lens packaging structure supported thereon without damage to the PCB, wherein a first side of the lens packaging structure further comprises a recess configured to at least partially receive the lens support structure therein.

2. The optoelectronic component according to claim 1, wherein the lens support structure further comprises two or more metal elements.

3. The optoelectronic component according to claim 2, wherein each of the metal elements of the lens support structure defines a cavity.

4. The optoelectronic component according to claim 3, wherein each cavity of the metal elements is configured to removably attach the lens support structure to the PCB via solder deposited therein.

5. The optoelectronic component according to claim 4, wherein the metal elements, when subjected to heat at a defined temperature, are configured to detach the lens support structure from the PCB via melting of the solder disposed between the lens support structure and the PCB.

6. The optoelectronic component according to claim 1, wherein the lens packaging structure is removably attached to the lens support structure via an adhesive.

7. The optoelectronic component according to claim 6, wherein the adhesive is an epoxy.

8. An adaptable lens assembly comprising:
a lens packaging structure supporting an optical lens at a focal distance; and a lens support structure defining:
   a first side removably attached to the lens packaging structure; and
   a second side configured to removably attach the lens support structure to a printed circuit board (PCB), wherein the attachment between the second side of the lens support structure and the PCB is configured to enable selective attachment and detachment of the lens support structure and supported lens packaging structure without causing damage to the PCB, wherein a first side of the lens packaging structure further comprises a recess configured to at least partially receive the lens support structure therein.

9. The adaptable lens assembly according to claim 8, wherein the lens support structure further comprises two or more metal elements.

10. The adaptable lens assembly according to claim 9, wherein each of the metal elements defines a cavity.

11. The adaptable lens assembly according to claim 10, wherein each cavity of the metal elements of the lens support structure is configured to removably attach the lens support structure to the PCB via solder deposited therein.

12. The adaptable lens assembly according to claim 11, wherein the metal elements, when subjected to heat at a defined temperature, are configured to detach the lens support structure from the PCB via melting of the solder disposed between the lens support structure and the PCB.

13. The adaptable lens assembly according to claim 8, wherein the lens packaging structure is removably attached to the lens support structure via an adhesive.

14. The adaptable lens assembly according to claim 13, wherein the adhesive is an epoxy.

15. A method comprising:
providing a printed circuit board (PCB);
providing a lens packaging structure supporting an optical lens at a focal distance;
providing a lens support structure defining a first side and a second side;
removably attaching the lens packaging structure on the first side; and
removably attaching the lens support structure to the PCB via the second side,
wherein the attachment between the second side of the lens support structure and the PCB is configured to enable selective attachment and detachment of the lens support structure and supported lens packaging structure without causing damage to the PCB, wherein a first side of the lens packaging structure further comprises a recess configured to at least partially receive the lens support structure therein.

16. The method according to claim 15, wherein removably attaching the lens support structure to the PCB via the second side further comprises soldering each of at least two metal elements of the lens support structure to the PCB.

17. The method according to claim 15, wherein supporting the lens packaging structure on the first side further comprises removably attaching the lens packaging structure to the lens support structure via an adhesive.

18. The method according to claim 15, further comprising:
heating the PCB to a defined temperature; and
removing the lens support structure and lens packaging structure supported thereon from the PCB.

* * * * *